United States Patent
Shih et al.

(10) Patent No.: US 8,802,359 B2
(45) Date of Patent: Aug. 12, 2014

(54) UV GLASS PRODUCTION METHOD

(75) Inventors: Minghung Shih, Shenzhen (CN); Mingwen Lin, Shenzhen (CN); Meng Li, Shenzhen (CN); Weichen Lin, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 79 days.

(21) Appl. No.: 13/380,191

(22) PCT Filed: Dec. 4, 2011

(86) PCT No.: PCT/CN2011/083428
§ 371 (c)(1),
(2), (4) Date: Dec. 22, 2011

(87) PCT Pub. No.: WO2013/078695
PCT Pub. Date: Jun. 6, 2013

(65) Prior Publication Data
US 2013/0137045 A1    May 30, 2013

(30) Foreign Application Priority Data
Nov. 29, 2011   (CN) .......................... 2011 1 0386632

(51) Int. Cl.
*G03F 7/00*    (2006.01)
(52) U.S. Cl.
USPC ........................................................ 430/321
(58) Field of Classification Search
USPC .......................................... 430/321; 349/187
See application file for complete search history.

(56) References Cited

U.S. PATENT DOCUMENTS

| | | | | |
|---|---|---|---|---|
| 6,654,100 | B2 * | 11/2003 | Yoda | 355/53 |
| 2003/0147040 | A1 * | 8/2003 | Park et al. | 349/187 |
| 2009/0098479 | A1 * | 4/2009 | Sykes et al. | 430/270.1 |

FOREIGN PATENT DOCUMENTS

| | | |
|---|---|---|
| CN | 1115415 A | 1/1996 |
| CN | 1435715 A | 8/2003 |
| CN | 101196690 A | 6/2008 |
| CN | 101196690 A | 6/2008 |
| CN | 101520599 A | 9/2009 |
| CN | 101713926 A | 5/2010 |
| CN | 101986206 A | 3/2011 |
| JP | 11154639 A | 6/1999 |
| JP | 2000269122 A | 9/2000 |

(Continued)

OTHER PUBLICATIONS

Zhou Yu, the International Searching Authority written comments, Sep. 2012, CN.

(Continued)

*Primary Examiner* — Stewart Fraser
(74) *Attorney, Agent, or Firm* — IPro, Inc.; Na Xu

(57) ABSTRACT

The present invention discloses a UV glass production method, comprising the steps: arranging a blade on an exposure stage; controlling the position of an exposure area on a glass substrate by regulating the position of the blade; removing a film layer from the area to be transparent; and forming a UV mask in the area to be shaded. In the present invention, a mask blade is adopted, can individually move and be accurately controlled individually; thus, rays of an exposure machine can be accurately positioned for producing a UV glass which meets standards. Moreover, in the present invention, there is no need to design a light cover especially so as to save the design and production cost of the light cover; thus, the present invention can ensure the production accuracy and effectively save the production cost.

5 Claims, 3 Drawing Sheets

(56) References Cited

FOREIGN PATENT DOCUMENTS

| | | |
|---|---|---|
| JP | 2004310063 A | 11/2004 |
| JP | 2006040915 A | 2/2006 |
| JP | 2009141263 A | 6/2009 |
| JP | 2010039360 A | 2/2010 |
| JP | 2010249963 A | 11/2010 |

OTHER PUBLICATIONS

Wang Dawei, the first office action, Mar. 2013, CN.

* cited by examiner

UV GLASS PRODUCTION METHOD

TECHNICAL FIELD

The present invention relates to the field of liquid crystal displays, and more particularly to a UV glass production method.

BACKGROUND

In current TFT-LCD industry, when a frame rubber is cured in the production process of a liquid crystal cell, a UV glass is used; a UV mask on the UV glass is used for shading a display area (AA) for an alignment film (PI) and a liquid crystal area so that the areas are not influenced by ultraviolet radiation; meanwhile, the position of the frame rubber is exposed to ultraviolet radiation for achieving the purpose of solidification. There are two UV glass production methods in general; one production method is: designing the UV mask and forming a UV glass with the UV mask in a specific position through exposure of the light cover; another method is: using a peripheric exposure machine of an array substrate for exposing the metal film layer in the position of the frame rubber so as to form the UV mask on the glass substrate. However, two methods have the following defects respectively: in the mode of exposure by the light cover, because the light cover has a high price, especially for a large light cover of advanced lines, the mode is disadvantageous for reducing the production cost of products; in the mode of the peripheric exposure machine, because the accuracy is not high, the production result is greatly different from practical standards to be achieved frequently.

SUMMARY

The aim of the present invention is to provide a UV glass production method with low cost and high precision.

The purpose of the present invention is achieved by the following technical schemes:

A UV glass production method comprises the steps:

A: arranging a blade on an exposure stage; controlling the position of an exposure area on a glass substrate by regulating the position of the blade; removing a metal film layer from the area to be transparent; and forming a UV mask in the area to be shaded.

Preferably, the blade is a mask blade arranged on an exposure machine; because the self mask blade is adopted, no additional investment is increased and the cost is lower.

Preferably, the step A comprises:

A1: forming a metal film layer which shade light on the glass substrate;

A2: arranging a blade on an exposure stage; forming a reservation area pattern on the glass substrate; removing the metal film layer of other parts of the glass substrate through treatment of exposure; using the reservation area pattern for forming patterns, such as GE mask, glass ID and the like, of the exposure machine;

A3: forming a metal film layer and a coating photoresist on the glass substrate; treating a rubber frame area to be exposed by exposure through the blade and removing the metal film of the area.

Preferably, the step A2 comprises:

A2.1: firstly, disposing the metal film layer of the corresponding area of the rubber frame around the glass substrate through the exposure machine;

A2.2: forming a reservation area pattern on the glass substrate; and removing the metal film layer of other parts of the glass substrate through the treatment of exposure.

Preferably, the step A3 comprises:

A3.1: forming a metal film layer and a coating photoresist on the glass substrate; shading each area corresponding to a liquid crystal cell through the blade; revealing other areas besides the areas corresponding to the liquid crystal cell to be treated by exposure;

A3.2: developing, etching, photoresistive stripping, reserving the UV mask and reserving the metal film layer of the GE mask of the UV light cover in sequence.

In the present invention, a mask blade is adopted, can individually move and be accurately controlled individually; thus, rays of the exposure machine can be accurately positioned for producing a UV glass which meets standards. In the prior art, a shading area is formed by encircling the blade on the light cover; then, exposure is conducted above the light cover to form the UV mask; in the present invention, the light cover is not used; the blade is directly used to form the exposure area; after the areas except for the shading part are directly exposed, the metal film layer is removed so as to save the design and production cost of the light cover. Compared with a peripheric light leakage machine, the exposure machine has high accuracy and wide coverage range; precise exposure can be completely achieved by controlling the blade to produce a high-quality UV glass.

Wherein: 100. UV glass; 110. loop seal; 120. reservation area pattern; 121 GE mask; 130. UV mask.

DETAILED DESCRIPTION

The present invention will further be described in detail in accordance with the figures and the preferred examples.

In current TFT-LCD industry, when a frame rubber is cured in the production process of a liquid crystal cell, a UV glass 100 is used; a UV mask 130 on the UV glass 100 is used for shading a display area (AA) for an alignment film (PI) and a liquid crystal area so that the areas are not influenced by ultraviolet radiation; meanwhile, the position of the frame rubber is exposed to ultraviolet radiation for achieving the purpose of solidification. The present invention discloses a UV glass 100 production method with low cost and high precision, which comprises the following steps:

Example 1: finishing the production of the UV glass through the regulation of the position of the mask blade of a Canon exposure machine and free layout exposure.

Figure 1:
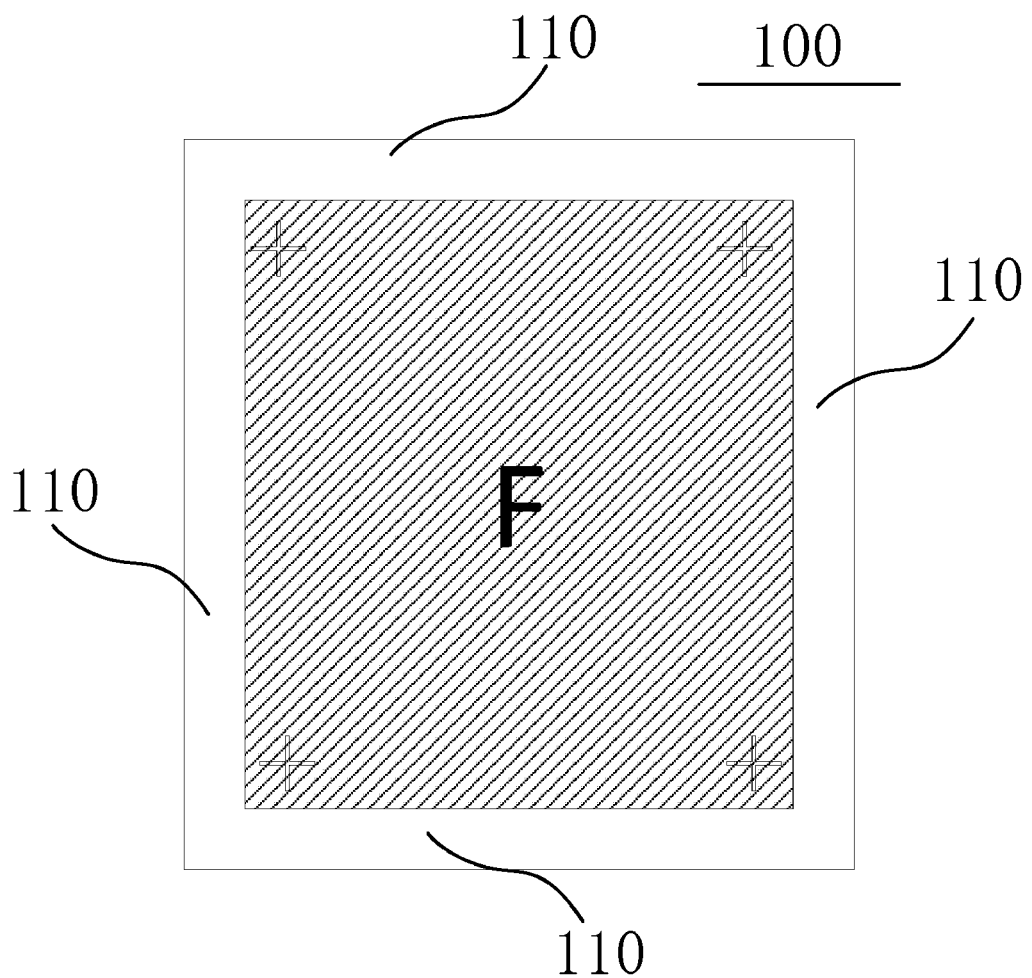
FIG. 1 is a schematic diagram of step 1 in the example of the present invention.

Step 1: as shown in FIG. 1, firstly, a metal film layer which shades light is formed on the glass substrate; then, a known method is used for finishing the exposure process of a normal glass substrate; a peripheric exposure machine is used for washing off the metal film layer in the position of the loop seal 110 around the glass substrate—in this step, a pattern comprising a GE mask 121 will be formed on the glass substrate.

Figure 2:
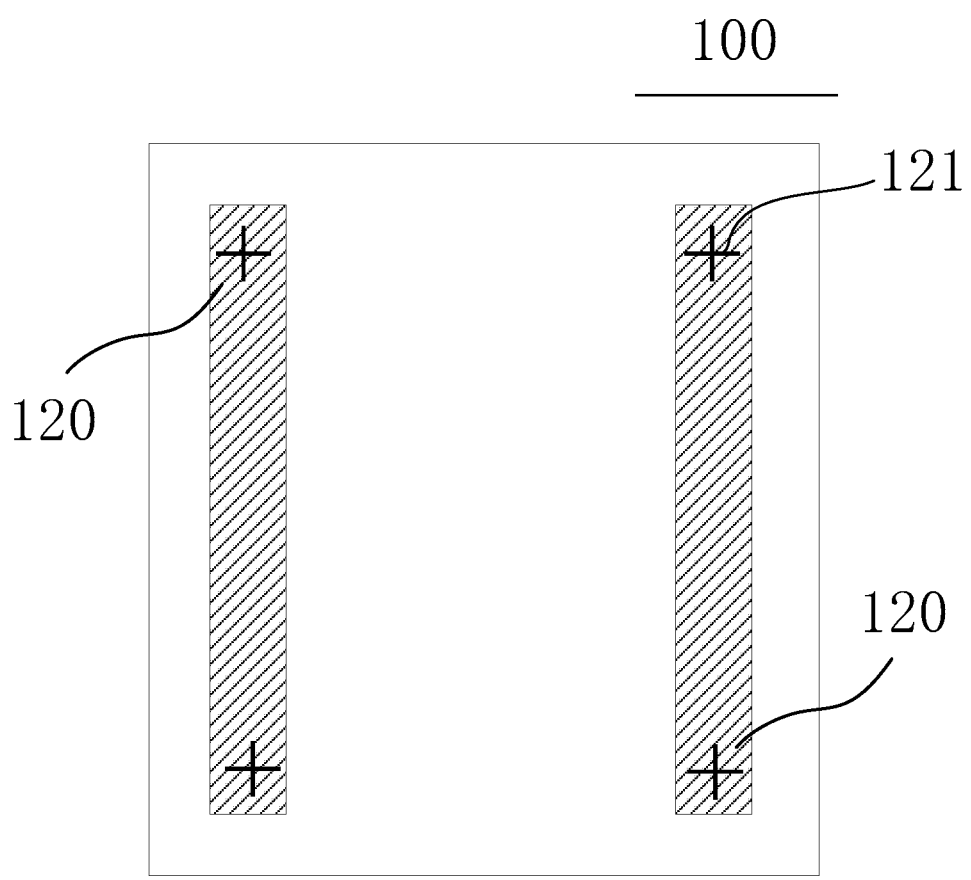
FIG. 2 is a schematic diagram of step 2 in the example of the present invention.

Step 2: as shown in FIG. 2, the light cover is not used; only the blade on a mask stage is used for shading the area of the process mark around a large blade; the large blade after finishing step 1 is exposed secondly; then, the production process of developing, etching and stripping photoresist is finished—in this step, the reservation area patterns 120 will be formed, i.e. GE mask 121 of UV light cover and glass ID pattern; meanwhile, the metal film layers of other areas are removed.

Figure 3:
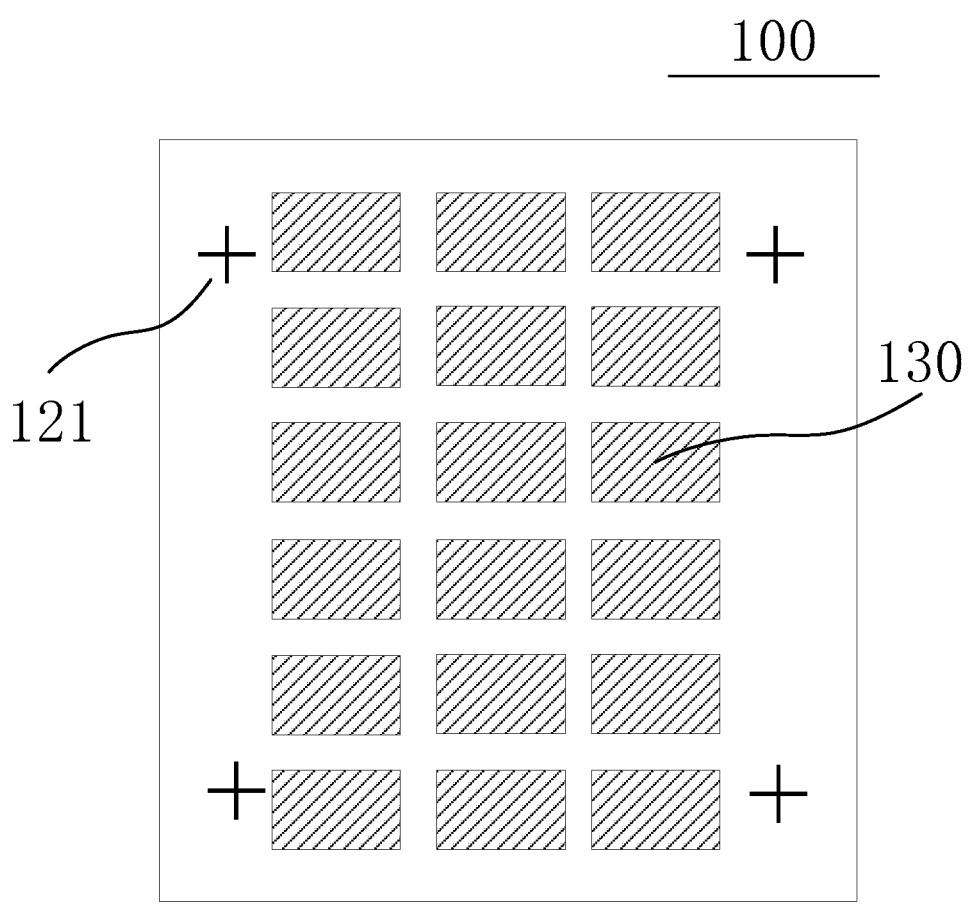
FIG. 3 is a schematic diagram of step 3 in the example of the present invention.

Step 3: as shown in FIG. 3, after step 2 is finished, the large blade is plated with a film (metal film layer) and coated with photoresist again; the light cover is not used; only the blade on the mask stage is used for shading; the areas to be exposed are exposed; the peripheric exposure machine is used for washing off the metal film layer in the position of the loop seal 110 around the glass substrate and the metal film layer in the corresponding position of the rubber frame around each liquid crystal cell; then, the steps of developing, etching and photoresistive stripping are conducted in sequence to form the UV mask 130 corresponding to each liquid crystal cell. Thus, the UV glass 100 is produced.

The present invention is described in detail in accordance with the above contents with the specific preferred examples. However, this invention is not limited to the specific examples. In the present invention, the self blade of the exposure machine can be adopted, or other controllable blades can also be individually adopted; the exposure machine is not limited to the Canon exposure machine; exposure machines of other brands, such as Nikon, NSK, HHT and the like, can also be adopted. For the ordinary technical personnel of the technical field of the present invention, on the premise of keeping the conception of the present invention, the technical personnel can also make simple deductions or replacements, and all of which should be considered to belong to the protection scope of the present invention.

We claim:

1. A UV glass production method, comprising the steps:
   A: arranging a blade on an exposure stage; controlling the position of an exposure area on a glass substrate by regulating the position of the blade; removing a metal film layer from the area to be transparent; and forming a UV mask in an area to be shaded, and wherein said step A comprises:
      A1: forming a metal film layer which shades light on the glass substrate;
      A2: arranging a blade on an exposure stage; forming reservation area patterns on said glass substrate; removing the metal film layer of other parts of the glass substrate through treatment of exposure;
      A3: forming a metal film layer and a coating photoresist on the glass substrate; treating a rubber frame area to be exposed by exposure through the blade and removing the metal film of an area which is the rubber frame area to be exposed.

2. The UV glass production method of claim 1, wherein said blade is a mask blade arranged on an exposure machine.

3. The UV glass production method of claim 1, wherein said step A2 comprises:
   A2.1: firstly, disposing the metal film layer of the corresponding area of a rubber frame around the glass substrate through the exposure machine;
   A2.2: forming reservation area patterns on said glass substrate; and removing the metal film layer of other parts of the glass substrate through treatment of exposure.

4. The UV glass production method of claim 1, wherein said step A3 comprises:
   A3.1: forming a metal film layer and a coating photoresist on the glass substrate; shading each area corresponding to a liquid crystal cell through the blade; revealing other areas besides the areas corresponding to the liquid crystal cell to be treated by exposure;
   A3.2: developing, etching, photoresistive stripping, reserving the UV mask and the metal film layer of the reservation area patterns in sequence.

5. The UV glass production method of claim 1, wherein said reservation area patterns are a GE mask and a glass ID pattern.

* * * * *